(12) United States Patent
Rachmady et al.

(10) Patent No.: US 9,786,786 B2
(45) Date of Patent: Oct. 10, 2017

(54) NON-PLANAR QUANTUM WELL DEVICE HAVING INTERFACIAL LAYER AND METHOD OF FORMING SAME

(71) Applicant: Intel Corporation, Santa Clara, CA (US)

(72) Inventors: Willy Rachmady, Beaverton, OR (US); Ravi Pillarisetty, Portland, OR (US); Van H. Le, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/345,546

(22) Filed: Nov. 8, 2016

(65) Prior Publication Data
US 2017/0054026 A1    Feb. 23, 2017

Related U.S. Application Data

(63) Continuation of application No. 14/804,019, filed on Jul. 20, 2015, now Pat. No. 9,502,568, which is a
(Continued)

(51) Int. Cl.
*H01L 21/00*    (2006.01)
*H01L 21/84*    (2006.01)
(Continued)

(52) U.S. Cl.
CPC .......... *H01L 29/7851* (2013.01); *B82Y 10/00* (2013.01); *H01L 21/30604* (2013.01);
(Continued)

(58) Field of Classification Search
CPC ........... H01L 29/122; H01L 31/035236; H01L 33/04; H01L 27/10841; H01L 27/10864; H01L 31/035254
See application file for complete search history.

(56) References Cited

U.S. PATENT DOCUMENTS 8,097,911 B2    1/2012 Keller
2006/0237770 A1    10/2006 Huang
(Continued)

FOREIGN PATENT DOCUMENTS

CN    1669153    9/2005
CN    1761068    4/2006
(Continued)

OTHER PUBLICATIONS

International Searching Authority, "Notification of Transmittal of the International Search Report and the Written Opinion of the International Searching Authority," mailed Apr. 25, 2012, in International application No. PCT/US2011/053173.
(Continued)

*Primary Examiner* — Sonya D McCall Shepard
(74) *Attorney, Agent, or Firm* — Trop, Pruner & Hu, P.C.

(57) ABSTRACT

Techniques are disclosed for forming a non-planar quantum well structure. In particular, the quantum well structure can be implemented with group IV or III-V semiconductor materials and includes a fin structure. In one example case, a non-planar quantum well device is provided, which includes a quantum well structure having a substrate (e.g. SiGe or GaAs buffer on silicon), a IV or III-V material barrier layer (e.g., SiGe or GaAs or AlGaAs), and a quantum well layer. A fin structure is formed in the quantum well structure, and an interfacial layer provided over the fin structure. A gate metal can be deposited across the fin structure. Drain/source regions can be formed at respective ends of the fin structure.

20 Claims, 9 Drawing Sheets

Related U.S. Application Data continuation of application No. 14/060,557, filed on Oct. 22, 2013, now Pat. No. 9,087,887, which is a continuation of application No. 12/924,307, filed on Sep. 24, 2010, now Pat. No. 8,575,653.

(51) Int. Cl.

| | | |
|---|---|---|
| *H01L 29/78* | (2006.01) | |
| *B82Y 10/00* | (2011.01) | |
| *H01L 29/66* | (2006.01) | |
| *H01L 29/775* | (2006.01) | |
| *H01L 29/267* | (2006.01) | |
| *H01L 29/165* | (2006.01) | |
| *H01L 29/10* | (2006.01) | |
| *H01L 29/15* | (2006.01) | |
| *H01L 21/306* | (2006.01) | |
| *H01L 21/762* | (2006.01) | |
| *H01L 29/06* | (2006.01) | |
| *H01L 29/12* | (2006.01) | |
| *H01L 29/51* | (2006.01) | |

(52) U.S. Cl.
CPC .... *H01L 21/76224* (2013.01); *H01L 29/0649* (2013.01); *H01L 29/1037* (2013.01); *H01L 29/1054* (2013.01); *H01L 29/122* (2013.01); *H01L 29/151* (2013.01); *H01L 29/165* (2013.01); *H01L 29/267* (2013.01); *H01L 29/66431* (2013.01); *H01L 29/66439* (2013.01); *H01L 29/66787* (2013.01); *H01L 29/66795* (2013.01); *H01L 29/775* (2013.01); *H01L 29/785* (2013.01); *H01L 29/513* (2013.01)

(56) References Cited

U.S. PATENT DOCUMENTS

| | | |
|---|---|---|
| 2006/0292765 A1 | 12/2006 | Blanchard |
| 2008/0121932 A1 | 5/2008 | Ranade |
| 2008/0237577 A1 | 10/2008 | Chui |
| 2009/0085027 A1 | 4/2009 | Jin |
| 2009/0298245 A1 | 12/2009 | Doris |
| 2010/0163959 A1 | 7/2010 | Keller |
| 2011/0068375 A1 | 3/2011 | Jakschik |
| 2011/0260173 A1 | 10/2011 | Wang |

FOREIGN PATENT DOCUMENTS

| | | |
|---|---|---|
| CN | 101819996 | 9/2010 |
| KR | 20090125148 | 12/2009 |
| TW | 200638550 | 11/2006 |
| WO | 2011087570 | 7/2011 |

OTHER PUBLICATIONS

China State Intellectual Property Office "Office Action" in Application No. 201180047252.4 Mailed on Apr. 8, 2015.
Korean Patent Office "Notice of Preliminary Rejection" in Application No. 2013-7008163 Mailed on Mar. 11, 2014.
European Patent Office, Extended Search Report mailed Feb. 24, 2016 in European Patent Application No. 1827698.9.
Taiwan Intellectual Property Office "Office Action" in Application No. 100134376 Mailed on Jul. 17, 2015.

NON-PLANAR QUANTUM WELL DEVICE HAVING INTERFACIAL LAYER AND METHOD OF FORMING SAME

This application is a continuation of U.S. patent application Ser. No. 14/804,019, filed Jul. 20, 2015 and entitled "Non-Planar Quantum Well Device Having Interfacial Layer and Method of Forming Same", which is a continuation of U.S. patent application Ser. No. 14/060,557, filed Oct. 22, 2013, now U.S. Pat. No. 9,087,887, issued Jul. 21, 2015 also entitled "Non-Planar Quantum Well Device Having Interfacial Layer and Method of Forming Same", which is a continuation of U.S. patent application Ser. No. 12/924,307, filed Sep. 24, 2010, now U.S. Pat. No. 8,575,653, issued Nov. 5, 2013 also entitled "Non-Planar Quantum Well Device Having Interfacial Layer and Method of Forming Same." The content of each of the above applications is hereby incorporated by reference.

BACKGROUND

Quantum well transistor devices formed in epitaxially grown semiconductor heterostructures, typically in III-V or silicon-germanium/germanium (SiGe/Ge) material systems, offer exceptionally high carrier mobility in the transistor channel. In addition, these devices provide exceptionally high drive current performance. However, non-planar quantum well transistors tend to exhibit charge spill-over and an electrically poor high-k dielectric and germanium interface at least by virtue of the thin high-k material, in this deleteriously affecting the performance of the device.

DETAILED DESCRIPTION

Figure 1:
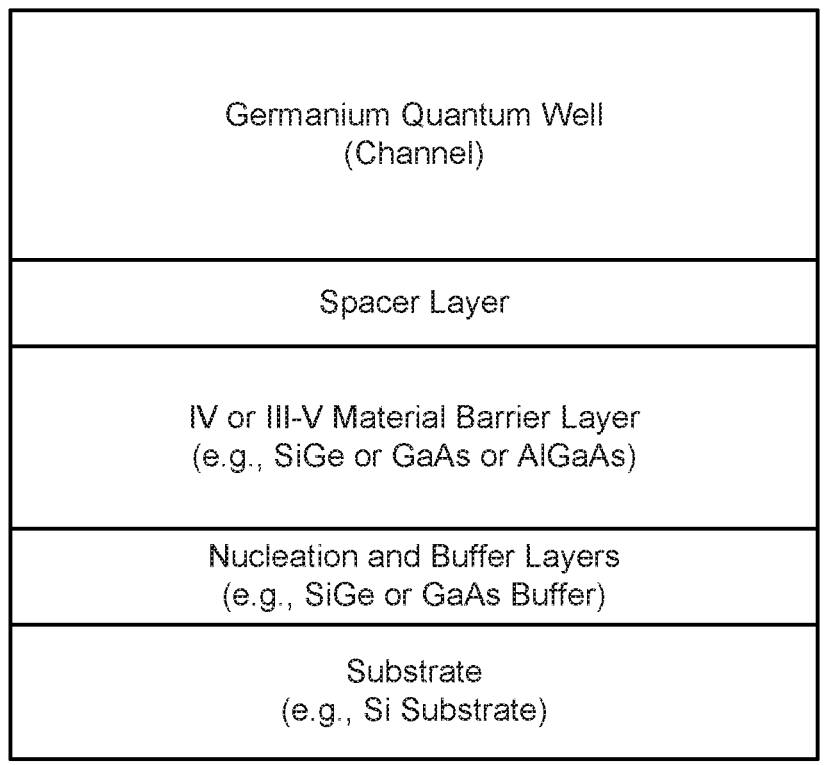
FIG. 1 illustrates a quantum well growth structure in accordance with one embodiment of the present invention.

Techniques are disclosed for forming a non-planar germanium quantum well structure exhibiting improved electrical performance. In particular, the quantum well structure can be implemented with group IV or III-V semiconductor materials and includes a germanium fin structure, so as to effectively provide a hybrid structure. The techniques can be used, for example, to improve short channel effects and gate length (Lg) scalability in a modulation/delta doped non-planar device. Electrostatics benefits of a fin-based device are achieved, while simultaneously retaining the high mobility benefits of a modulation/delta doped device.

As previously explained, quantum well transistor devices formed in epitaxially grown semiconductor heterostructures, for example in III-V material systems, offer very high carrier mobility in the transistor channel. These conventional devices provide exceptionally high drive current performance. Such quantum well systems may be fabricated with planar architectures or with non-planar architectures.

Non-planar transistor architectures, such as FinFET structures (e.g., double-gate, tri-gate and surround gate structures), can be used to improve electrostatics and short channel effects, and hence enable Lg scalability. However, such non-planar architectures are generally regarded as incompatible with high quality, high mobility, quantum well transistors formed in epitaxially grown heterostructures. Thus, and in accordance with an embodiment of the present invention, non-planar Ge quantum well transistor device is provided including an interfacial layer disposed between the Ge fin and the high-k layer. Optionally, an intermediate layer may be provided between the interfacial layer and the high-k layer in order to establish better electrical compatibility with the high-k material, as will be explained in further detail below. The device can be formed from semiconductor heterostructures, such as Ge, SiGe, Si, and/or gallium arsenide (GaAs), aluminum arsenide (AlAs). Any number of epitaxially grown heterostructures fabricated with group IV or III-V materials can be configured with a germanium fin-based channel. The hetrerostructure can be patterned and etched into one or more narrow fins.

The process flow for fabricating the device can be implemented, for example, in a similar fashion to that used in fabricating a conventional silicon based non-planar device, including shallow trench isolation (STI), gate stack, source/drain regions, and contact formation.

One advantage of a IV/III-V/Ge system configured in accordance with an embodiment of the present invention is that charge spillover in the non-planar structure is greatly reduced, allowing charge confinement in the Ge quantum well fin.

Thus, given a desired Ge quantum well structure, a fin structure (along with gate, source and drain regions, and contacts, etc) can be formed in accordance with an embodiment of the present invention. So, in accordance with one example embodiment, formation of a non-planar Ge quantum well transistor device may generally include the provision of a silicon encapsulation layer or interfacial layer on the fin surfaces in order to allow containment of the charge within the Ge quantum well fin.

FIG. 1 illustrates a cross-sectional side view of an example Ge quantum well growth structure that can be used in producing a non-planar germanium quantum well device, in accordance with one embodiment of the present invention. The quantum well growth structure can be, for example, a conventional SiGe/Ge or GaAs/Ge quantum well structure. Although no-capping layer is shown in FIG. 1, some embodiments may include the provision of a capping layer on the structure, as would be recognized by one skilled in the art. Thus, as previously explained, however, note that a non-planar Ge quantum well transistor device formed in accordance with an embodiment of the present invention can be implemented with any number quantum well growth structures, configured with various IV or III-V materials, optional doping layers, and buffer layers, as will be apparent in light of this disclosure. The claimed invention is not intended to be limited to any particular quantum well growth configuration.

As can be seen in FIG. 1, the quantum well growth structure includes a substrate, upon which nucleation and buffer layers are formed. The structure further includes a group IV or III-V material barrier layer upon which a spacer layer is formed, upon which a Ge quantum well layer is formed. Other embodiments may include fewer layers (e.g., fewer buffer layers) or more layers (e.g., additional spacer and/or doped layers below quantum well layer) or different layers (e.g., formed with different semiconductor materials, formulations, and/or dopants). The layers may be implemented with any suitable layer thicknesses and other desired layer parameters, using established semiconductor processes (e.g., metal organic chemical vapor deposition, molecular beam epitaxy, photolithography, or other such suitable processes), and may be graded (e.g., in linear or step fashion) to improve lattice constant match between neighboring layers of otherwise lattice diverse materials. In general, the specific layers and dimensions of the structure will depend on factors such as the desired device performance, fab capability, and semiconductor materials used.

The substrate may be implemented as typically done, and any number of suitable substrate types and materials can be used here (e.g., p-type, n-type, neutral-type, silicon, germanium, high or low resistivity, off-cut or not off-cut, bulk, silicon-on-insulator, etc). In one example embodiment, the substrate is a bulk Si substrate. In another example embodiment, the substrate is a bulk Ge substrate. Other embodiments may use a semiconductor on insulator configuration, such as silicon on insulator (SOI) or germanium on insulator (GeOI) or SiGe on insulator (SiGeOI).

The nucleation and buffer layers are formed on the substrate, and also may be implemented as typically done. In one specific example embodiment, the nucleation and buffer layers are made of SiGe (e.g., 60% Ge) or GaAs and have an overall thickness of about 0.5 to 2.0 μm (e.g., nucleation layer of about 25 nm to 50 nm thick and the buffer layer is about 0.3 μm to 1.9 μm thick). As is known, the nucleation and buffer layers can be used to fill the lowest substrate terraces with atomic bi-layers of, for example, III-V materials such as GaAs material. The nucleation layer can by used to create an anti-phase domain-free virtual polar substrate, and the buffer layer may be used to provide dislocation filtering buffer that can provide compressive strain for a quantum well structure and/or control of the lattice mismatch between the substrate and the barrier layer. The buffer layers may also include a graded buffer, which can also be implemented as conventionally done. As is known, by forming the graded buffer layer, dislocations may glide along relatively diagonal planes therewithin so as to effectively control the lattice mismatch between the substrate and the IV/III-V material barrier layer (and/or any intervening layers). As will be apparent, such graded layers can be used in other locations the quantum well structure or stack. Note that other quantum well structures that can benefit from an embodiment of the present invention may be implemented without the nucleation and/or buffer layers. For example, embodiments having a substrate and barrier layer that are implemented with materials having sufficiently similar lattice constants may be implemented without a graded buffer.

The IV/III-V barrier layer is formed on the nucleation and buffer layer in this example embodiment, and can also be implemented as conventionally done. In one specific example embodiment, the barrier layer is implemented with $Si_{1-x}Ge_x$ (where x is in the range of 40 to 80, such as 60), or GaAs, or $Al_{1-x}Ga_xAs$ (where x is in the range of 50 to 90, such as 70), and has a thickness in the range of 4 nm and 120 nm (e.g., 100 nm, +/−20 nm). Generally, the barrier layer is formed of a material having a higher band gap than that of the material forming the overlying quantum well layer, and is of sufficient thickness to provide a potential barrier to charge carriers in the transistor channel. As will be appreciated, the actual make up and thickness of the barrier layer will depend on factors such as the substrate and quantum well layer materials and/or thicknesses. Numerous such barrier materials and configurations can be used here, as will be appreciated in light of this disclosure.

If a doping layer is provided (not shown), the doping layer may be formed on (or within) the barrier layer in the example quantum well growth structure, and can also be implemented as conventionally done. In general, the barrier layer can be doped by the doping layer to supply carriers to the quantum well layer. For an n-type device utilizing a SiGe material barrier layer, the doping may be implemented, for example, using boron and/or tellurium impurities, and for a p-type device the doping layer may be implemented, for example, using beryllium (Be) and/or carbon. The thickness of the doping layer will depend on factors such as the type of doping and the materials used. For instance, in one example embodiment the doping layer is a layer of boron delta doped $Si_{40}Ge_{60}$ having a thickness between about 3 Å to 15 Å. In another embodiment, the doping layer is a layer of Be modulation doped GaAs having a thickness between about 15 Å to 60 Å. The doping can be selected, for instance, based upon the sheet carrier concentration that is useful in the channel of the Ge quantum well layer. As will be appreciated in light of this disclosure, an embodiment of the present invention may be implemented with quantum well structures having any type of suitable doping layer or layers.

The spacer layer is formed on (or over) the buffer layer, and can also be implemented as conventionally done. In one specific example embodiment, the spacer layer is implemented with $Si_{1-x}Ge_x$ (where x is in the range of 40 to 80, such as 60), or GaAs, or $Al_{1-x}Ga_xAs$ (where x is in the range of 50 to 90, such as 70), and has a thickness in the range of 0.2 nm to 70 nm (e.g., 5 nm). In general, the spacer layer can be configured to provide compressive strain to the quantum well layer as it acts as a semiconductive channel. Note that other quantum well structures that can benefit from an embodiment of the present invention may be implemented without the spacer layer.

The quantum well layer can also be implemented as conventionally done. In general, the quantum well layer is implemented with undoped germanium, having an example thickness of about 20 Å to 500 Å. Numerous other quantum well layer configurations can be used here, as will be appreciated. In a more general sense, the quantum well layer has a smaller band gap than that of the IV/III-V barrier layer, is undoped, and is of a sufficient thickness to provide adequate channel conductance for a given application such as a transistor for a memory cell or a logic circuit. The quantum well layer may be strained by the barrier layer, an upper barrier layer, or both.

After formation of the device stack, which generally includes the substrate through the quantum well layer as previously described, a capping layer (not shown) may optionally be formed over the quantum well layer. In one specific example embodiment, the capping layer is implemented with SiGe or Si and has a thickness in the range of 2 to 10 nm (e.g., 6 nm). As will be appreciated, other suitable capping layer materials may be used to protect the underlying germanium quantum well layer.

FIGS. 2 through 7 illustrate with cross-sectional and perspective views the formation of a Ge fin-based quantum well structure configured in accordance with an embodiment of the present invention. As will be appreciated, the fin-based structure can be formed on the device stack shown in FIG. 1, or any number of other quantum well growth structures. Note that intermediate processing, such as planarization (e.g., chemical mechanical polishing, or CMP) and subsequent cleaning processes, may be included throughout the formation process, even though such processing may not be expressly discussed.

Figure 2:
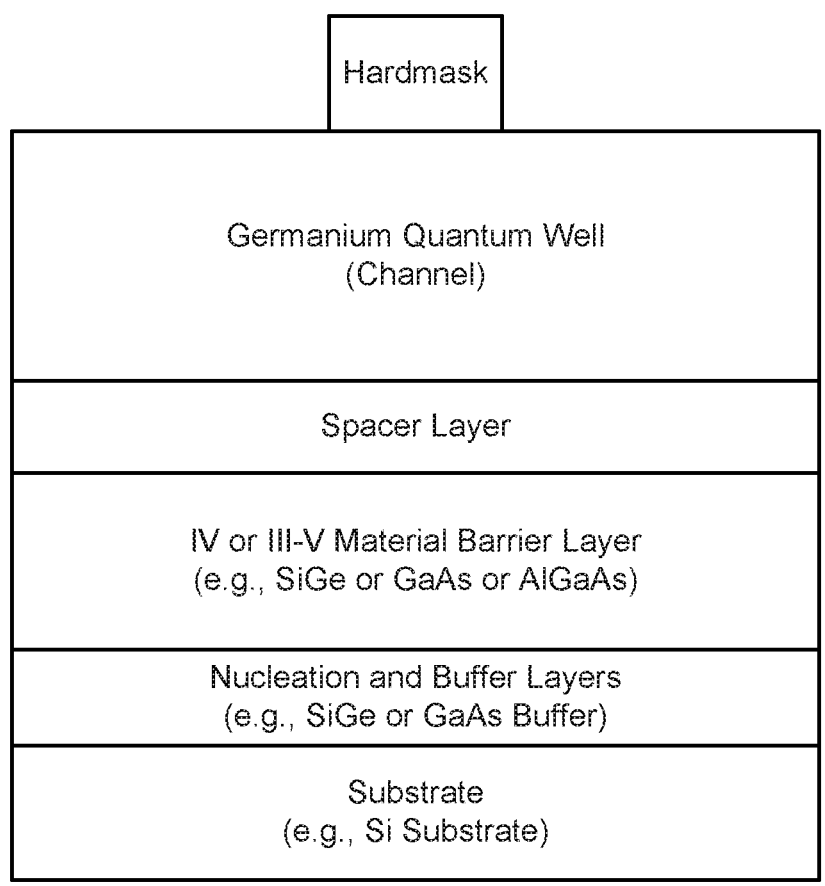
FIG. 2 illustrates deposition and patterning of a hardmask on the quantum well growth structure of FIG. 1, in accordance with one embodiment of the present invention.

FIG. 2 illustrates deposition and patterning of a hardmask on the quantum well growth structure of FIG. 1, in accordance with one embodiment of the present invention. This patterning, which is for shallow trench isolation (STI) formation, can be carried out using standard photolithography, including deposition of hardmask material (e.g., such as silicon dioxide, silicon nitride, and/or other suitable hardmask materials), patterning the resist on a portion of the hardmask that will remain temporarily to protect the underlying fin structure (Ge channel in this case), etching to remove the unmasked (no resist) portions of the hardmask (e.g., using a dry etch, or other suitable hardmask removal process), and then stripping the patterned resist. In the example embodiment shown in FIG. 2, the resulting hardmask is central to the device stack and formed in one location, but in other embodiments, the hardmask may be offset to one side of the stack and/or located in multiple places on the stack, depending on the particular active device.

Figure 3:
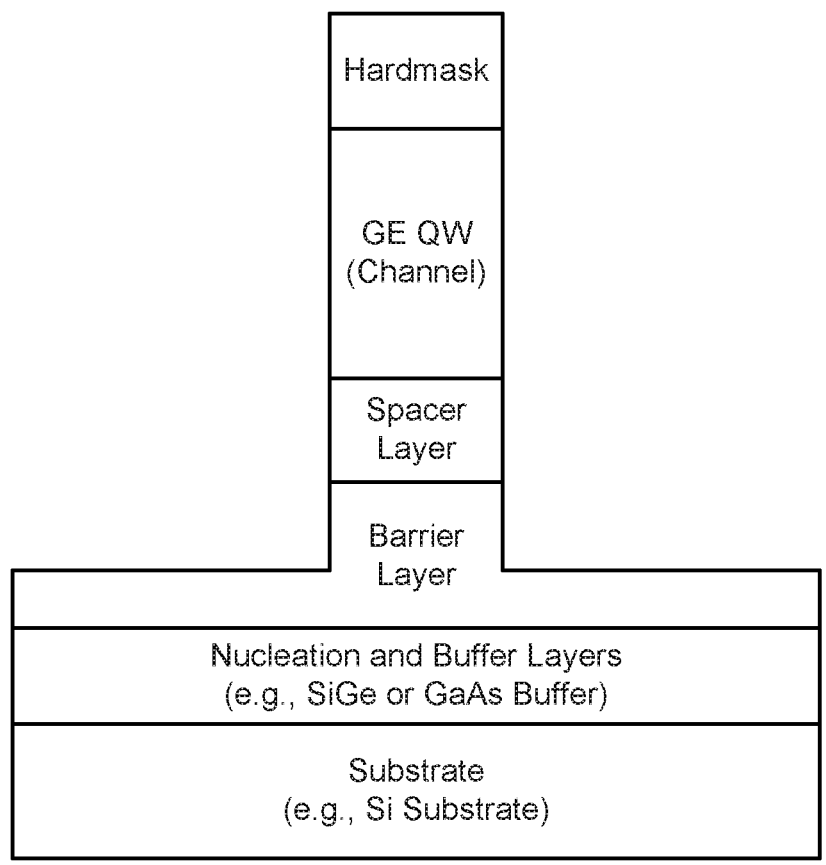
FIG. 3 illustrates a shallow trench isolation (STI) etch to form a germanium fin structure on the quantum well growth structure of FIG. 2, in accordance with one embodiment of the present invention.
Figure 4:
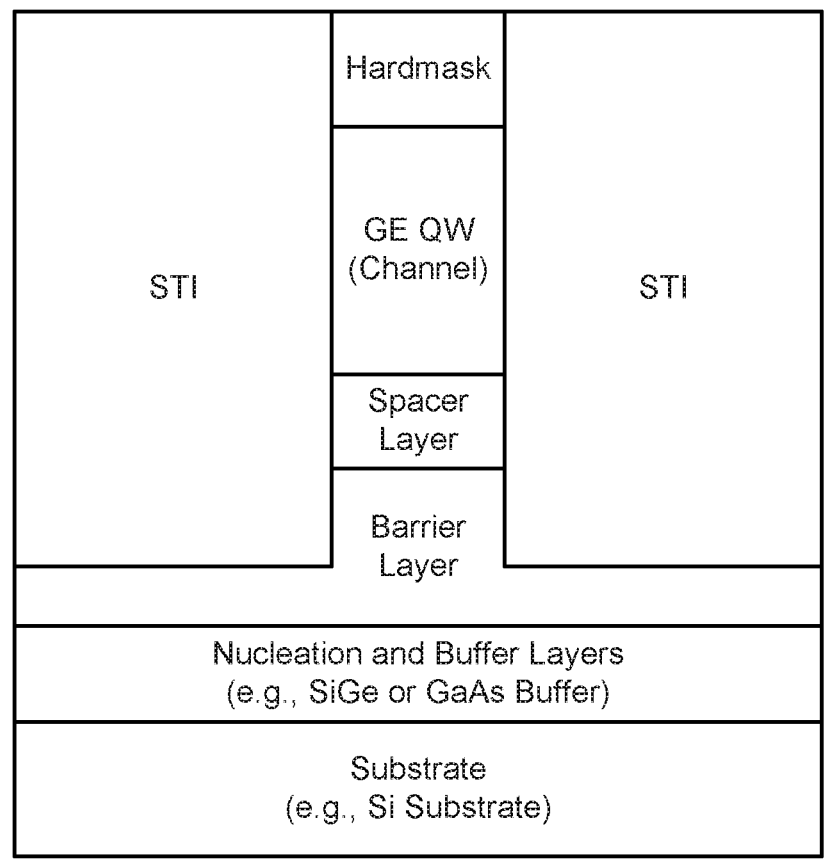
FIG. 4 illustrates deposition and planarization of dielectric material around the germanium fin structure of the quantum well growth structure of FIG. 3, in accordance with one embodiment of the present invention.

FIG. 3 illustrates a shallow trench isolation (STI) etch to form a germanium fin structure on the quantum well growth structure of FIG. 2, and FIG. 4 illustrates deposition and planarization of dielectric material around the germanium fin structure, in accordance with one embodiment of the present invention. The germanium fin is biaxially compressively strained a the outset by virtue of a lattice mismatch between the germanium and the IV or III/V material of the barrier layer and spacer layer. An etch of the material in the germanium layer results in a uniaxial strain in the resulting Ge fin This can also be carried out using standard photolithography, including etching to remove portions of the stack that are unprotected by the hardmask (e.g., wet or dry etch), and deposition of a dielectric material (e.g., such as $SiO_2$, or other suitable dielectric materials). The depth of the STI etch may vary, but in some example embodiments is in the range of 0 Å to 5000 Å below the bottom of the Ge quantum well layer. In this example embodiment, the etch depth is almost to the bottom of the material barrier layer. In general, the etch should be to a sufficient depth that allows the quantum well channel to be electrically isolated (e.g., from neighboring componentry or other potential interference sources), such as, for example, down to the barrier layer or even down to the substrate layer. After formation of the STI and deposition of dielectric material, the deposited dielectric materials can be polished/planarized (e.g., using CMP). Note the hardmask can be left on to protect the germanium channel.

Figure 5:
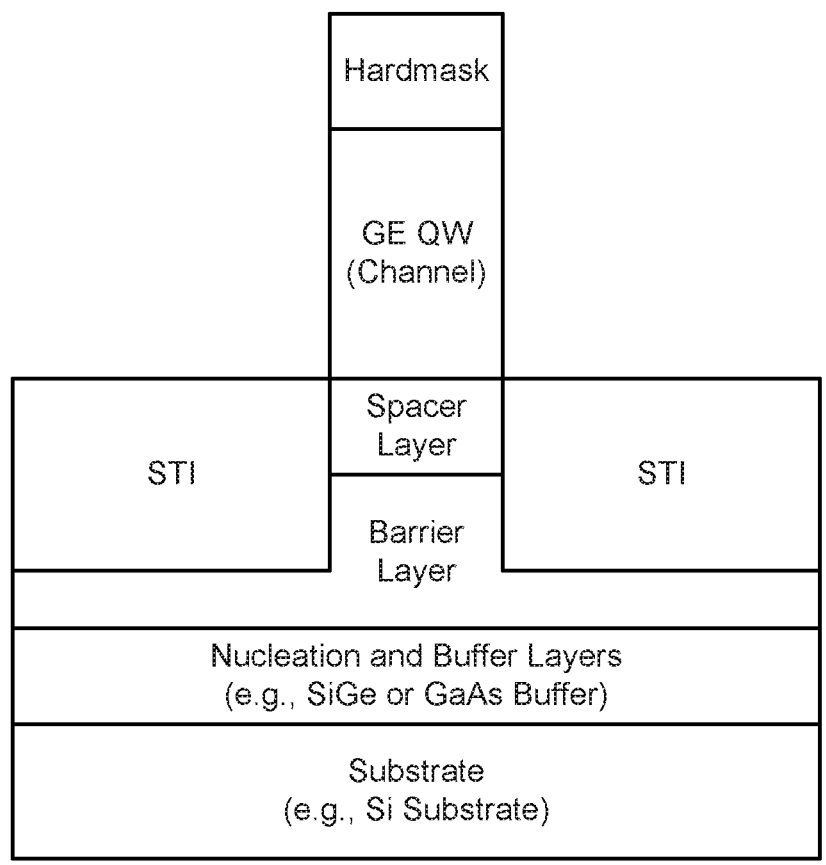
FIG. 5 illustrates etching to recess the STI dielectric material of the quantum well growth structure of FIG. 4, in accordance with one embodiment of the present invention.

FIG. 5 illustrates etching to recess the STI dielectric material of the quantum well growth structure of FIG. 4, in accordance with one embodiment of the present invention. This can also be carried out using standard photolithography, including etching to remove the dielectric material (e.g., using wet etch, but dry etch may be used as well). The depth of the recess etch may vary, but, for example, it may generally be between the bottom of the germanium quantum well layer (channel) and above the spacer layer. As can be seen, in this example embodiment, the recess etch depth is to the bottom of the germanium quantum well layer (channel). Note the hardmask is still in place to protect the Ge fin structure (or channel).

Figure 6:
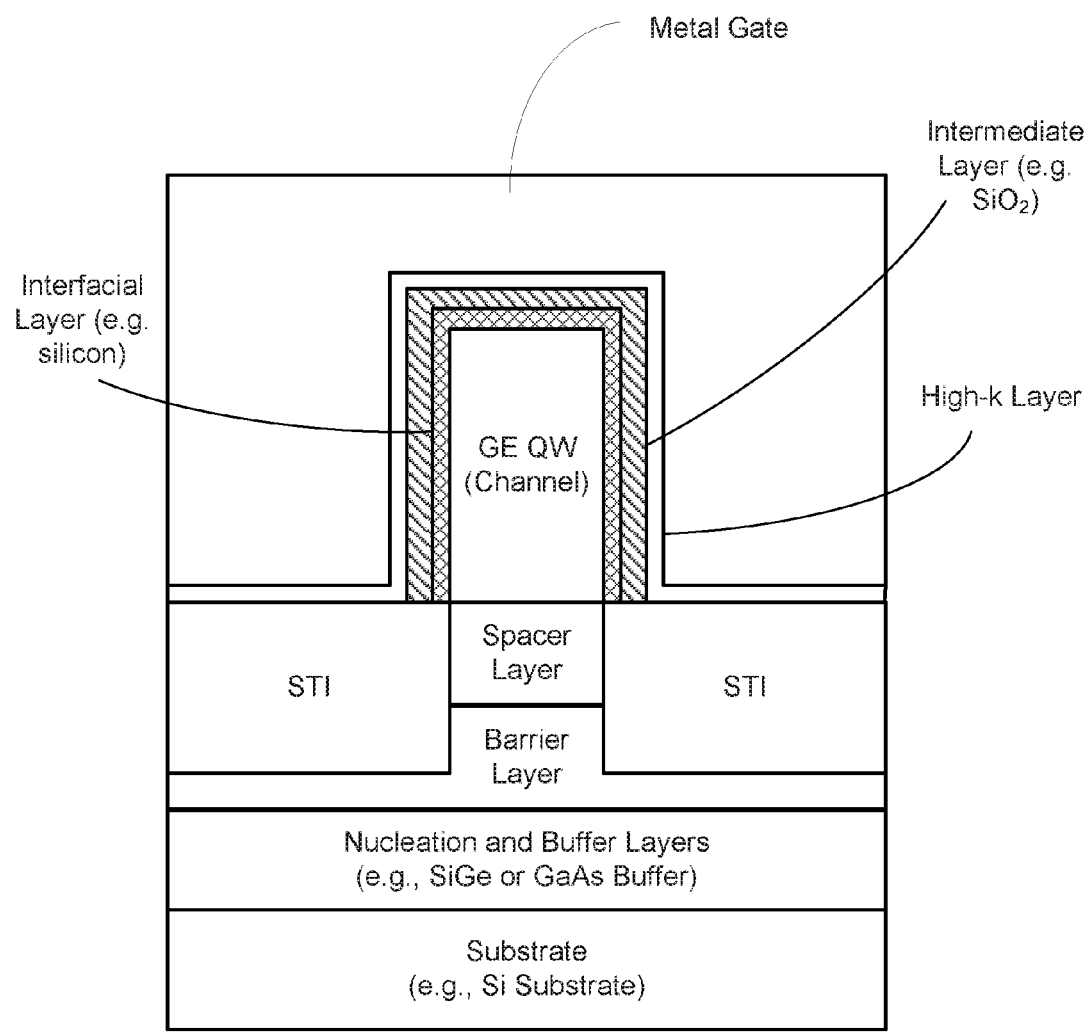
FIG. 6 illustrates gate electrode formation on the germanium fin structure of the quantum well growth structure of FIG. 5, in accordance with one embodiment of the present invention.
Figure 7:
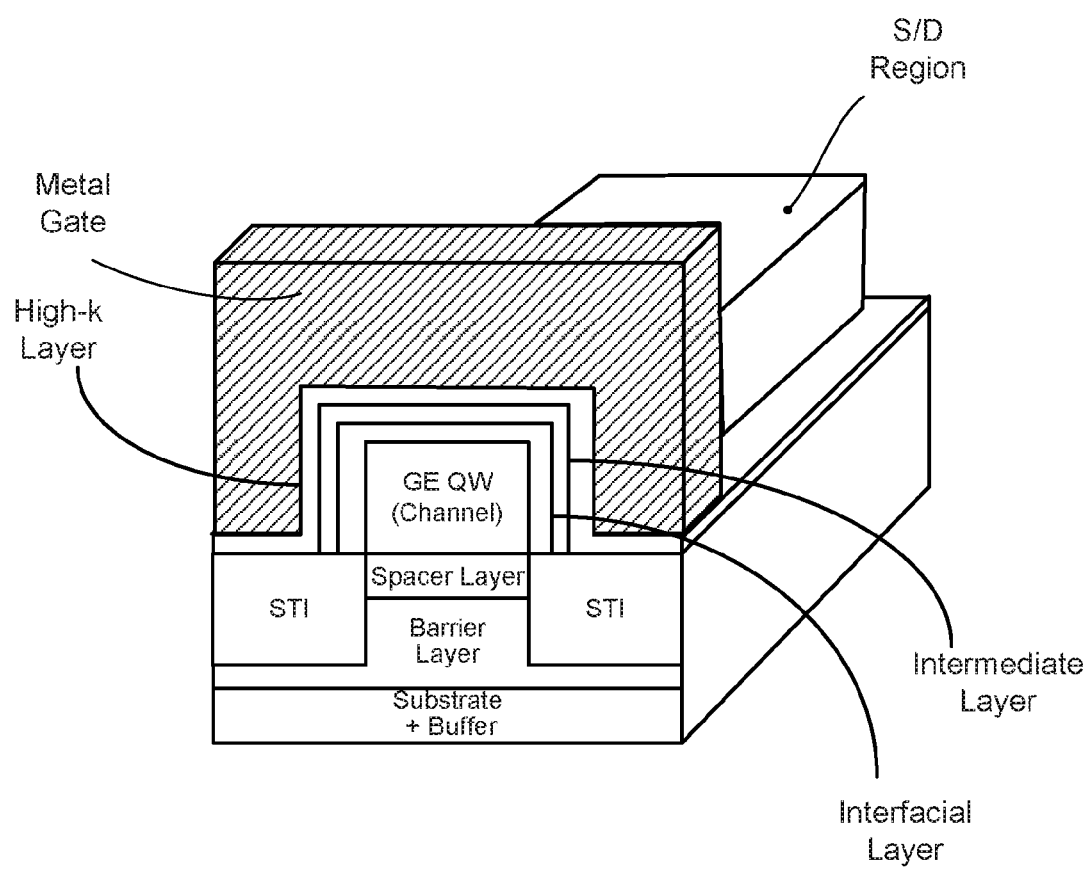
FIG. 7 illustrates a perspective view of the device shown in FIG. 6, configured in accordance with an embodiment of the present invention.

FIG. 6 illustrates gate electrode formation on the germanium fin structure of the quantum well growth structure of FIG. 5, in accordance with one embodiment of the present invention. The resulting structure, shown in perspective view in FIG. 7, is a effectively a Ge quantum well structure configured as a FinFET device (hence, non-planar). As is known, a FinFET is a transistor built around a thin strip of semiconductor material (generally referred to as the fin). The FinFET device includes the standard field effect transistor (FET) nodes, including a gate, a gate dielectric (typically high-k), a source region, and a drain region (only one of source/drain regions is generally shown in FIG. 7). The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin). The height of the fin may be determined by device requirements, and may be limited only by etching capabilities.

As can be seen be in FIG. 6, according to an embodiment, the hardmask may be removed (e.g., wet or dry etch) and an interfacial layer may be provided over the Ge channel. This interfacial layer can be, for example, a layer of silicon, which may be epitaxially provided onto all of the surfaces of the Ge fin. As seen in FIG. 6, the interfacial layer covers all active surfaces of the fin, that is, the exposed 100 (top surface of fin) and 110 (side surfaces of fin) surfaces as shown. In the case of a double-gate device, the interfacial layer may cover only the 110 or side surfaces of the fin, the top 100 surface of the fin being provided with an insulation layer such as silicon nitride. The interfacial layer may include one or more layers, such as one or more monolayers of silicon. Preferably, the interfacial layer is as thin as possible. For example, the interfacial layer may include a monolayer of silicon epitaxially provided onto the fin. The thinness of the interfacial layer is advantageous to prevent any empty states, charge centers or defects being present within the interfacial layer, in this way preventing the migration of charges into the interfacial layer from the fin. The thicker the interfacial layer, the more of a chance that a material of the interfacial layer, such as silicon, would create defects at its interface with the germanium material of the fin by virtue of the lattice mismatch between the interfacial layer material and the fin material. However, an interfacial layer that is thicker than a monolayer of the interfacial layer material is also within the purview of embodiments, as long as it effectively prevents the migration of charge from the fin material toward the high-k material. Materials that would be suitable for the interfacial layer would have higher bandgaps than the bandgap of the fin material. In order to ensure a defect-free interfacial compatibility between the interfacial layer and the material of the fin, preferably, the interfacial layer is provided in such as a way as to present atom-to-atom bonding with the material of the fin. Thus, a preferred way of provided the interfacial layer is by way of epitaxy. The thickness of the interfacial layer can be, for example, between about 3 Å to about 9 Å.

Referring still to FIG. 6, optionally, an intermediate layer may be placed between the interfacial layer and the high-k layer. An intermediate layer may offer an electrical advantage where the material of the high-k layer has a tendency to present an interfacial incompatibility (e.g. the presence of dangling bonds) with the material of the interfacial layer. By way of example, where the high-k layer comprises hafnium oxide, and where the interfacial layer comprises silicon, an interface between the two layers may tend to present dangling bonds or defects that may allow the migration of charge therein. In such cases, it may be desirable to provide an intermediate layer between the high-k layer and the interfacial layer in order to mitigate the interfacial compatibility mentioned above, and to provide substantially electrically inert interfaces with the high-k layer on the one hand and with the interfacial layer on the other hand. A suitable material for the intermediate layer may include silicon dioxide. In general, the intermediate layer may include any dielectric material, such as for example a high-k or a low-k dielectric that provides an electrically compatible interface (i.e., an interface with no dangling bonds, defects or charge centers) with the material of the high-k layer. The intermediate layer may, for example, include alumina, zirconia or hafnium silicate. Where the interfacial layer includes silicon, an intermediate layer including silicon dioxide may be provided by oxidizing a surface of the silicon interfacial layer in a conventional manner, any other suitable way of providing an intermediate layer being however within the purview of embodiments. For example, the intermediate layer may be deposited according to any well known method of providing a dielectric layer, such as for example by using CVD, PVD or ALD. The thickness of the intermediate layer may be, for example, between about 5 Å to about 10 Å. To the extent that the material of the intermediate layer may include a dielectric material, it would serve as part of the gate dielectric including the high-k layer. As a result, a thickness of the high-k layer and of the intermediate layer may be determined to achieve an optimal result in terms of dielectric effectiveness and interfacial compatibility as would be recognized by one skilled in the art.

Referring still to FIG. 6, the high-k gate dielectric deposited on the top barrier can be, for instance, a film having a thickness in the range of 10 Å to 50 Å (e.g., 20 Å), and can be implemented, for instance, with hafnium oxide, alumina, tantalum pentaoxide, zirconium oxide, lanthanum aluminate, gadolinium scandate, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or other such materials having a dielectric constant greater than that of, for instance, silicon dioxide. The high-k gate dielectric may be provided according to any one of well known methods, such as, for example, using PVD, CVD or ALD. In general, there need not exist an atom-to-atom bond between the high-k layer and an intermediate layer if the intermediate layer is provided, as long as the provision of the intermediate layer substantially eliminates dangling bonds in the interfacial region between the fin material and the high-k material.

Referring still to FIG. 6, the gate metal deposited over the high-k gate dielectric can be, for example, nickel, gold, platinum, aluminum, titanium, palladium, titanium nickel or other suitable gate metal or alloy. Source and drain regions can be formed as conventionally done for a FinFET structure, and may be configured with the same metal as the gate or another suitable contact metal. As will be appreciated in light of this disclosure, the top barrier, high-k gate dielectric, gate metal, and source/drain regions can be implemented using standard FinFET processing.

Figure 8:
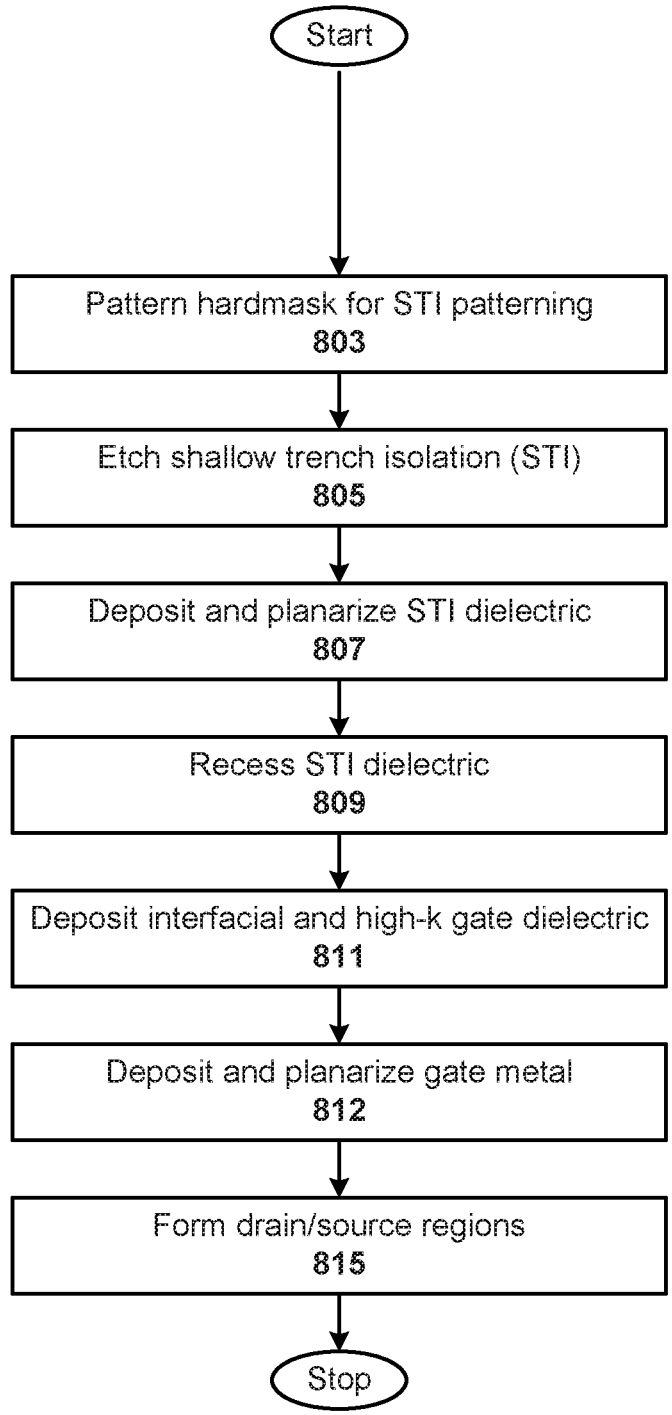
FIG. 8 illustrates a method for forming a germanium fin based quantum well structure, in accordance with one embodiment of the present invention.

FIG. 8 illustrates a method for forming a germanium fin based quantum well structure, in accordance with one embodiment of the present invention. The quantum well structure can be configured as desired, and generally includes a stack that includes a substrate, a IV/III-V barrier layer, and a quantum well layer.

The method includes patterning 803 a hardmask for shallow trench isolation (STI) patterning. The patterning may include, for instance, deposition of hardmask material, patterning resist on a portion of the hardmask that will remain temporarily to protect the underlying fin structure of the device during STI etching, etching to remove the unmasked (no resist) portions of the hardmask (e.g., using a dry etch, or other suitable hardmask removal process), and then stripping the patterned resist, to provide a patterned STI hardmask.

The method continues with etching 805 a STI into Ge quantum well structure, thereby forming a fin structure. In one example case, and as previously explained, the trench formation can be carried out using a one or more dry and/or wet etches. The method continues with depositing 807 dielectric material into the STI, and planarizing that dielectric material. The method continues with etching 809 to recess the STI material (e.g., down to the bottom of the Ge quantum well layer, and before the doping layer). The etch can be implemented, for instance, with a wet etch.

The method continues with providing 811 an interfacial layer and optional intermediate layer over the fin structure. Thereafter, the method continues at 811 by the provision of a high-k layer. The high-k gate dielectric can be, for instance, a film having a suitable thickness to sufficiently isolate the metal gate and a dielectric constant greater than that of, for instance, silicon dioxide. Other suitable gate dielectrics can be used (e.g., non-high-k dielectrics) here as well, and in some embodiments where the top barrier provides sufficient isolation on its own, no gate dielectric may be needed. The method continues with depositing 812 gate metal over the top barrier and across the isolated Ge fin structure forming the device channel, and forming 815 drain and source regions at respective ends of the fin structure (channel). The gate metal and source/drain regions can be implemented using standard processing (deposition, masking, etching, planarizing, etc).

Thus, a non-planar quantum well structure configured with an interfacial layer sandwiched between the fin and the high-k layer may be provided. The structure can be used, for example, as a FinFET device (e.g., double-gate or tri-gate FinFET) suitable for use in numerous applications (e.g., processors, memory, etc).

Numerous embodiments and configurations will be apparent in light of this disclosure. For instance, one example embodiment of the present invention provides a method for forming a non-planar quantum well structure. The method includes receiving a quantum well structure having a substrate, a IV or III-V material barrier layer, and an undoped germanium quantum well layer. The method further includes selectively etching the quantum well structure to form a germanium fin structure, depositing a interfacial layer and an optional intermediate layer over the fin structure, and depositing gate metal across the fin structure. In one particular case, selectively etching the quantum well structure includes patterning a hardmask on the quantum well structure for shallow trench isolation (STI) patterning, etching an STI into the quantum well structure, depositing dielectric material into the STI, and planarizing the dielectric material. In one such case, the dielectric material in the STI is recessed down to a bottom of the germanium quantum well layer. The method may include forming drain and source regions at respective ends of the fin structure. In another particular case, after depositing a interfacial layer over the fin structure and prior to depositing gate metal across the fin structure, the method further includes depositing a high-k gate dielectric layer over the interfacial layer. The quantum well structure can be, for example, an epitaxially grown heterostructure. A doping layer if provided may include, for instance, delta doping which modulation dopes an undoped germanium quantum well layer. In another particular case, an undoped germanium quantum well layer can be epitaxially grown after the doping layer. In one embodiment, the quantum well fin may be doped. In yet another embodiment, to further enhance the compressive strain within the fin, recessed source and drain regions may be provided and filled with a III/V or a SiGe material.

Another example embodiment of the present invention provides a non-planar quantum well device. The device includes a quantum well structure having a substrate, a IV or III-V material barrier layer, and a germanium quantum well layer. The device further includes a germanium fin structure formed in the quantum well structure, a interfacial layer provided over the fin structure, an optional intermediate layer provided over the interfacial layer, and gate metal deposited across the fin structure. The device may include, for example, recessed dielectric material in shallow trench isolation (STI) proximate the fin structure. In one such case, the dielectric material in the STI is recessed down to a bottom of the germanium quantum well layer. The device may include drain and source regions formed at respective ends of the fin structure. The device may include a high-k gate dielectric deposited between the interfacial layer and gate metal. In one example case, the non-planar quantum well structure comprises a FinFET device. In another example case, the IV or III-V material barrier layer is implemented with silicon germanium or gallium arsenide or aluminum gallium arsenide, and the substrate comprises a silicon germanium or gallium arsenide buffer on silicon. In another example case, the quantum well structure is an epitaxially grown heterostructure. In another example case, a doping layer if provided may include delta doping, which modulation dopes an undoped germanium quantum well layer. In another example case, an undoped germanium quantum well layer is expitaxially grown after the doping layer (on or within the barrier layer).

It will be appreciated that embodiments encompass the provision of a plurality of fin structures on a substrate, and that processes for forming a plurality of nMOS transistor structures or pMOS transistor structures may be performed on multiple fin structures in parallel. Thus, a single fin structure is shown here for the sake of simplicity. In addition, embodiments are not limited to the use of a germanium fin, but include within their scope the use of a fin made of any other suitable material.

Figure 9:
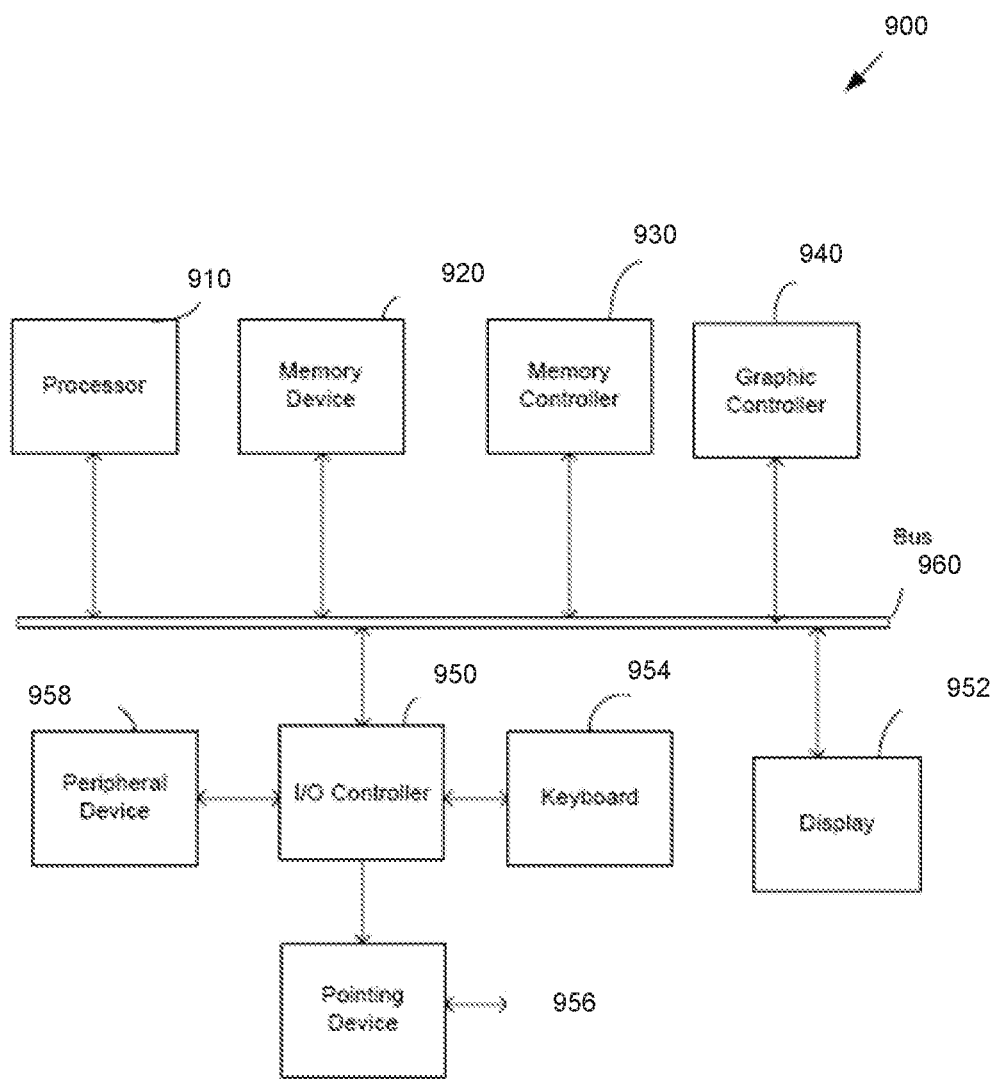
FIG. 9 illustrates a system according to one embodiment.

FIG. 9 shows a computer system according to an embodiment. System 900 includes a processor 910, a memory device 920, a memory controller 930, a graphics controller 940, an input and output (I/O) controller 950, a display 952, a keyboard 954, a pointing device 956, and a peripheral device 958, all of which may be communicatively coupled to each other through a bus 960, in some embodiments. Processor 910 may be a general purpose processor or an application specific integrated circuit (ASIC). I/O controller 950 may include a communication module for wired or wireless communication. Memory device 920 may be a dynamic random access memory (DRAM) device, a static random access memory (SRAM) device, a flash memory device, or a combination of these memory devices. Thus, in some embodiments, memory device 920 in system 900 does not have to include a DRAM device.

One or more of the components shown in system 900 may include one or more non-planar devices of the various embodiments included herein. For example, processor 910, or memory device 920, or at least a portion of I/O controller 950, or a combination of these components may include in an integrated circuit package that includes at least one embodiment of the structures herein.

These elements perform their conventional functions well known in the art. In particular, memory device 920 may be used in some cases to provide long-term storage for the executable instructions for a method for forming structures in accordance with some embodiments, and in other embodiments may be used to store on a shorter term basis the executable instructions of a method for forming structures in accordance with embodiments during execution by processor 910. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 920 may supply the processor 910 with the executable instructions for execution.

System 900 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method of forming a non-planar quantum well structure, comprising:
   providing a quantum well structure including a substrate and a quantum well layer that includes a channel region;
   selectively etching the quantum well structure to form a fin structure that is: (a) formed in the quantum well structure, and (b) includes the quantum well layer;
   providing a dielectric layer over the fin structure; and
   providing gate metal over the dielectric layer.

2. The method of claim 1, wherein the quantum well layer includes germanium.

3. The method of claim 1 comprising:
providing an interfacial layer over the fin structure, a material of the interfacial layer having a higher bandgap than a bandgap of a material of the fin structure; and
providing an intermediate layer over the interfacial layer prior to providing the dielectric layer.

4. The method of claim 3, wherein the interfacial layer comprises epitaxially grown silicon.

5. The method of claim 3, wherein the intermediate layer comprises a dielectric material different from a material of the dielectric layer.

6. A non-planar quantum well device comprising:
a quantum well structure including a substrate and a quantum well layer that includes a channel region;
a fin structure that: (a) is included in the quantum well structure and, (b) includes the quantum well layer;
a dielectric layer over the fin structure; and
a gate material over the dielectric layer.

7. The device of claim 6, wherein the quantum well layer includes germanium.

8. The device of claim 6 comprising an intermediate layer and an interfacial layer, wherein the intermediate layer is between the interfacial layer and the dielectric layer.

9. The device of claim 6 comprising an interfacial layer that covers a 100 surface and a 110 surface of the fin structure.

10. The device of claim 6 comprising an interfacial layer, over the fin structure, which comprises silicon.

11. The device of claim 10, wherein the silicon is epitaxial.

12. The device of claim 6, comprising an interfacial layer, over the fin structure, which comprises a single monolayer of atoms.

13. The device of claim 8, wherein the intermediate layer comprises a dielectric material different from a material of the dielectric layer.

14. The device of claim 13, wherein the intermediate layer comprises at least one of silicon dioxide, alumina, zirconia and hafnium silicate.

15. The device of claim 8, wherein the intermediate layer includes a material obtained from an oxidization of a surface of the interfacial layer.

16. The device of claim 6 comprising drain and source regions at respective ends of the fin structure.

17. The device of claim 6, wherein the quantum well structure further includes a doping layer.

18. The device of claim 6, wherein the quantum well layer is epitaxial.

19. A system comprising:
a processor including:
a quantum well structure including a substrate and a quantum well layer that includes a channel region;
a fin structure that (a) is included in the quantum well structure and, (b) includes the quantum well layer;
a dielectric layer over the fin structure; and
a gate material over the dielectric layer; and
a memory coupled to the processor.

20. The system of claim 19 comprising an interfacial layer and an intermediate layer; wherein (a) the interfacial layer is over the fin structure; (b) the interfacial layer comprises epitaxial silicon, and (c) the quantum well structure includes the intermediate layer, included between the interfacial layer and the dielectric layer, which comprises silicon dioxide.

* * * * *